United States Patent
Chih et al.

(10) Patent No.: US 8,754,498 B2
(45) Date of Patent: Jun. 17, 2014

(54) ANTIFUSE AND METHOD OF MAKING THE ANTIFUSE

(75) Inventors: Yue-Der Chih, HsinChu (TW); Chrong Jung Lin, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 386 days.

(21) Appl. No.: 12/606,497

(22) Filed: Oct. 27, 2009

(65) Prior Publication Data

US 2011/0095394 A1 Apr. 28, 2011

(51) Int. Cl.
*H01L 29/86* (2006.01)

(52) U.S. Cl.
USPC ............. 257/530; 257/529; 257/E21.675; 257/E23.147

(58) Field of Classification Search
USPC .......................................... 257/530
See application file for complete search history.

(56) References Cited

U.S. PATENT DOCUMENTS

| 6,087,707 | A * | 7/2000 | Lee et al. ................... 257/530 |
| 6,600,186 | B1 * | 7/2003 | Lee et al. ................... 257/530 |
| 7,208,364 | B2 * | 4/2007 | Pan et al. ................... 438/199 |
| 7,755,162 | B2 * | 7/2010 | Kurjanowicz et al. ..... 257/530 |
| 2002/0076886 | A1 * | 6/2002 | Rotondaro et al. ......... 438/279 |
| 2003/0107081 | A1 | 6/2003 | Lee et al. |
| 2003/0194840 | A1 * | 10/2003 | Murata ........................ 438/241 |
| 2004/0232446 | A1 * | 11/2004 | Nishimura et al. .......... 257/202 |
| 2006/0097325 | A1 * | 5/2006 | Yang et al. ................... 257/368 |
| 2006/0221698 | A1 * | 10/2006 | Obuchi ..................... 365/185.18 |
| 2006/0286741 | A1 * | 12/2006 | Pan et al. ..................... 438/238 |
| 2008/0019165 | A1 | 1/2008 | Lin et al. |
| 2009/0250737 | A1 * | 10/2009 | Candelier et al. ........... 257/296 |
| 2009/0251201 | A1 * | 10/2009 | Sung et al. ................... 327/525 |
| 2010/0120213 | A1 * | 5/2010 | Choi ............................ 438/241 |
| 2011/0122672 | A1 * | 5/2011 | Kodama et al. ............... 365/96 |

FOREIGN PATENT DOCUMENTS

CN 101488502 A 7/2009

OTHER PUBLICATIONS

Philippe Candelier et al., One Time Programmable Drift Antifuse Cell Reliability, IEEE OOCH37059. 38th Annual International Reliability physics symposium, San Jose, California, 2000 pp. 169-173.
Hyouk-Kyu Cha et al., A 32-KB Standard CMOS Antifuse One-Time Programmable ROM Embedded in a 16-bit Microcontroller, IEEE Journal of Solid-State Circuits, vol. 41, No. 9, Sep. 2006, pp. 2115-2124.
Office Action Oct. 26, 2011 in counterpart Chinese application.
Chinese Office Action dated May 15, 2012.

* cited by examiner

*Primary Examiner* — Matthew W Such
*Assistant Examiner* — Abul Kalam
(74) *Attorney, Agent, or Firm* — Duane Morris LLP (57) ABSTRACT

A method of making an antifuse includes providing a substrate having a bit line diffusion region and a capacitor diffusion region. A gate dielectric layer is formed over the substrate, and a word line is formed on the gate dielectric layer. An oxide layer is formed on the capacitor diffusion region, in a separate process step from forming the gate dielectric layer. A select line contact is formed above and contacting the oxide layer to form a capacitor having the oxide layer as a capacitor dielectric layer of the capacitor. The select line contact is configured for applying a voltage to cause permanent breakdown of the oxide layer to program the antifuse.

20 Claims, 6 Drawing Sheets

ANTIFUSE AND METHOD OF MAKING THE ANTIFUSE

FIELD OF THE INVENTION

The present disclosure relates to semiconductor fabrication generally, and more specifically to an antifuse.

BACKGROUND

An antifuse is an electrical device that starts with a high resistance and is designed to permanently create an electrically conductive path (typically when the voltage across the antifuse exceeds a certain level). Antifuses can be used to permanently program integrated circuits (ICs). For example, certain programmable logic arrays (PLAs) use antifuses to configure logic circuits and create a customized design from a standard IC design. Antifuse PLAs are one time programmable.

Philipe Candelier et al., "One Time Programmable Drift Antifuse Cell Reliability," 38th Annual International Reliability Physics Symposium, San Jose, Calif., 2000, describes a configuration in which the gate oxide layer of a complementary metal oxide semiconductor (CMOS) IC is used as the capacitor layer, allowing the fabrication of the antifuse during a standard CMOS process. The antifuse is a standard N+ polysilicon/5 nm oxide thickness/Nwell capacitor. The gate oxide is very well controlled at the process level (thickness, breakdown voltage, lifetime and the like) and can be broken with a limited current compared to poly or metal fuse. A high programming voltage for the antifuse is achieved on the low voltage CMOS process with a standard NMOS transistor in which the drain junction is replaced by Nwell implantation (Drift NMOS).

An antifuse design is desired that is easily scalable for advanced technology nodes.

SUMMARY OF THE INVENTION

In some embodiments, an antifuse comprises a substrate having a bit line diffusion region and a capacitor diffusion region. A gate dielectric layer is over the substrate. A word line is on the gate dielectric layer. An oxide layer is on the capacitor diffusion region. The oxide layer is substantially thicker than the gate dielectric layer. A select line contact is above and contacting the oxide layer to form a capacitor having the oxide layer as a capacitor dielectric layer thereof. The select line contact is configured for applying a voltage to cause permanent breakdown of the oxide layer to program the antifuse.

In some embodiments, a method of making an antifuse comprises providing a substrate having a bit line diffusion region and a capacitor diffusion region. A gate dielectric layer is formed over the substrate, and a word line on the gate dielectric layer. An oxide layer is formed on the capacitor diffusion region, in a separate process step from forming the gate dielectric layer. A select line contact is formed above and contacting the oxide layer to form a capacitor having the oxide layer as a capacitor dielectric layer thereof. The select line contact is configured for applying a voltage to cause permanent breakdown of the oxide layer to program the antifuse.

DETAILED DESCRIPTION

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

The inventors have determined that the prior art antifuse, in which the gate dielectric layer is also used as the antifuse capacitor dielectric layer, presents challenges when scaling the design to advanced technology nodes with dimensions smaller than 90 nm. At the 90 nm technology node, the gate dielectric has a thickness T1 of about 12 ångström. At smaller nodes, as the gate dielectric layer (and antifuse capacitor dielectric) becomes thinner, the breakdown behavior of the antifuse capacitor dielectric becomes hard to predict and control. As the antifuse capacitor dielectric becomes smaller, the leakage current of the antifuse before programming becomes similar to the current flow after breakdown, making it difficult to sense whether the antifuse has been programmed.

Embodiments are described below which use an oxide film other than the gate oxide (and formed in a separate process step from the gate oxide) as the breakdown dielectric of the antifuse capacitor. The oxide film is sufficiently thick so that a distance between a bottom of the select line contact and a surface of the capacitor diffusion region is from 2.5 to 7.5 times a thickness of the gate dielectric layer, reducing the leakage problem in the antifuse capacitor. In some embodiments, this dielectric is the resist protective oxide (RPO) film. The RPO film is a layer formed during a typical CMOS process, so use of the RPO film as the antifuse capacitor dielectric material does not add any layers to the CMOS process. In a standard CMOS process, the RPO layer is used during silicide formation, which forms a metal layer on the source and drain, and on top of the polysilicon gate to reduce resistance for making electrodes. The RPO layer is applied in the remaining regions which do not require silicidation. In an embodiment described below, the capacitor dielectric of the antifuse capacitor is formed in the same RPO layer formed over at least one portion of a CMOS device, which is formed on the same substrate as the antifuse.

Figure 1A:
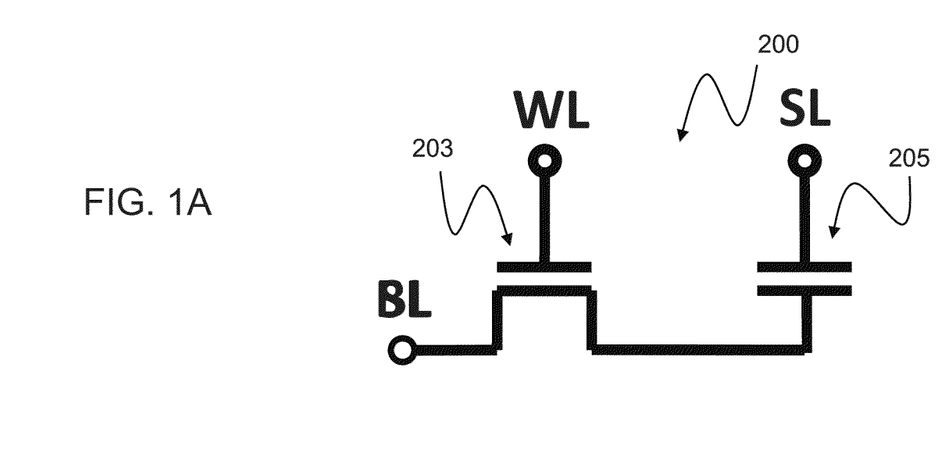
FIG. 1A is a schematic diagram of an exemplary antifuse before programming.

FIG. 1A is a schematic diagram of an antifuse prior to programming. The antifuse includes a transistor 203 having a bit line (BL) and word line (WL) connected to its gate. A capacitor 205 connects the transistor 203 to a select line (SL) having a high voltage potential. An antifuse to be programmed is selected for breakdown by applying a low voltage to the gate by way of the word line WL, and a high voltage breakdown pulse is applied to the capacitor 205 by way of select line SL.

Figure 1B:
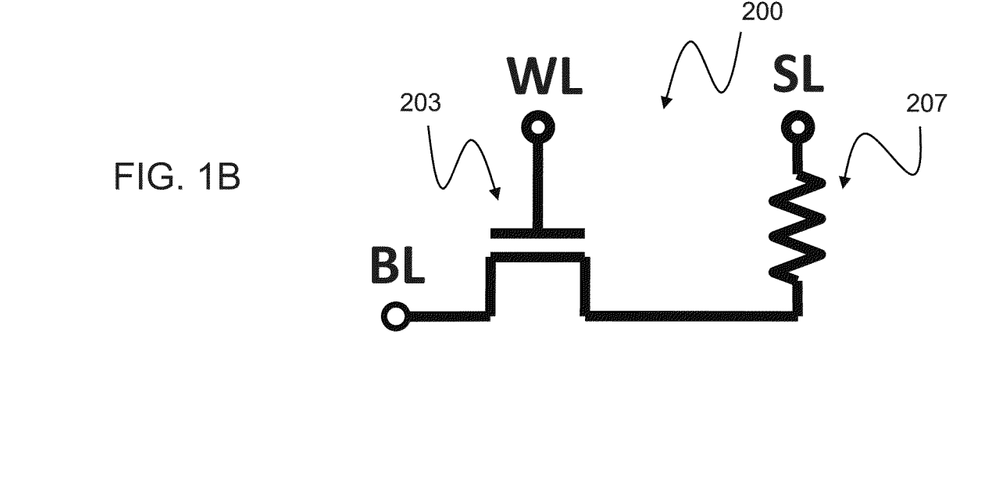
FIG. 1B is a schematic diagram of the antifuse of FIG. 1A after programming.

FIG. 1B is a schematic diagram of the antifuse of FIG. 1A, after programming. The capacitor dielectric has permanently broken down, forming a conductive path with a resistance 207.

Figure 2:
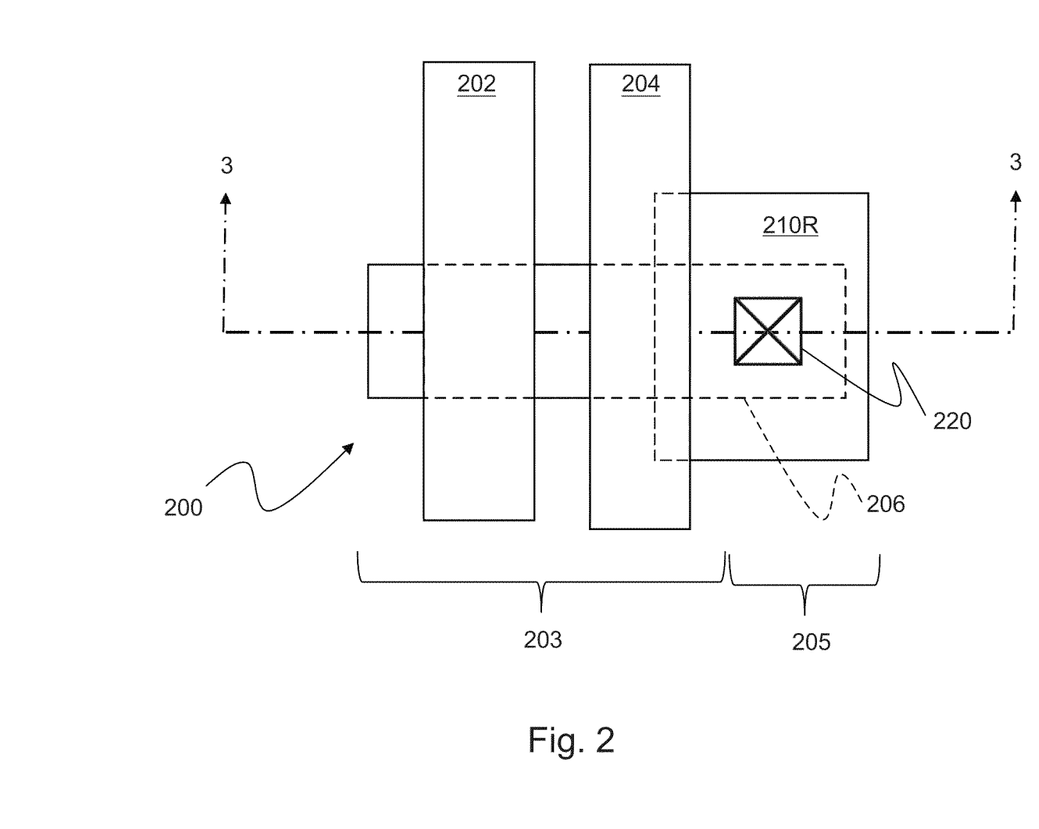
FIG. 2 is a plan view of an example of an antifuse described below.
Figure 3A:
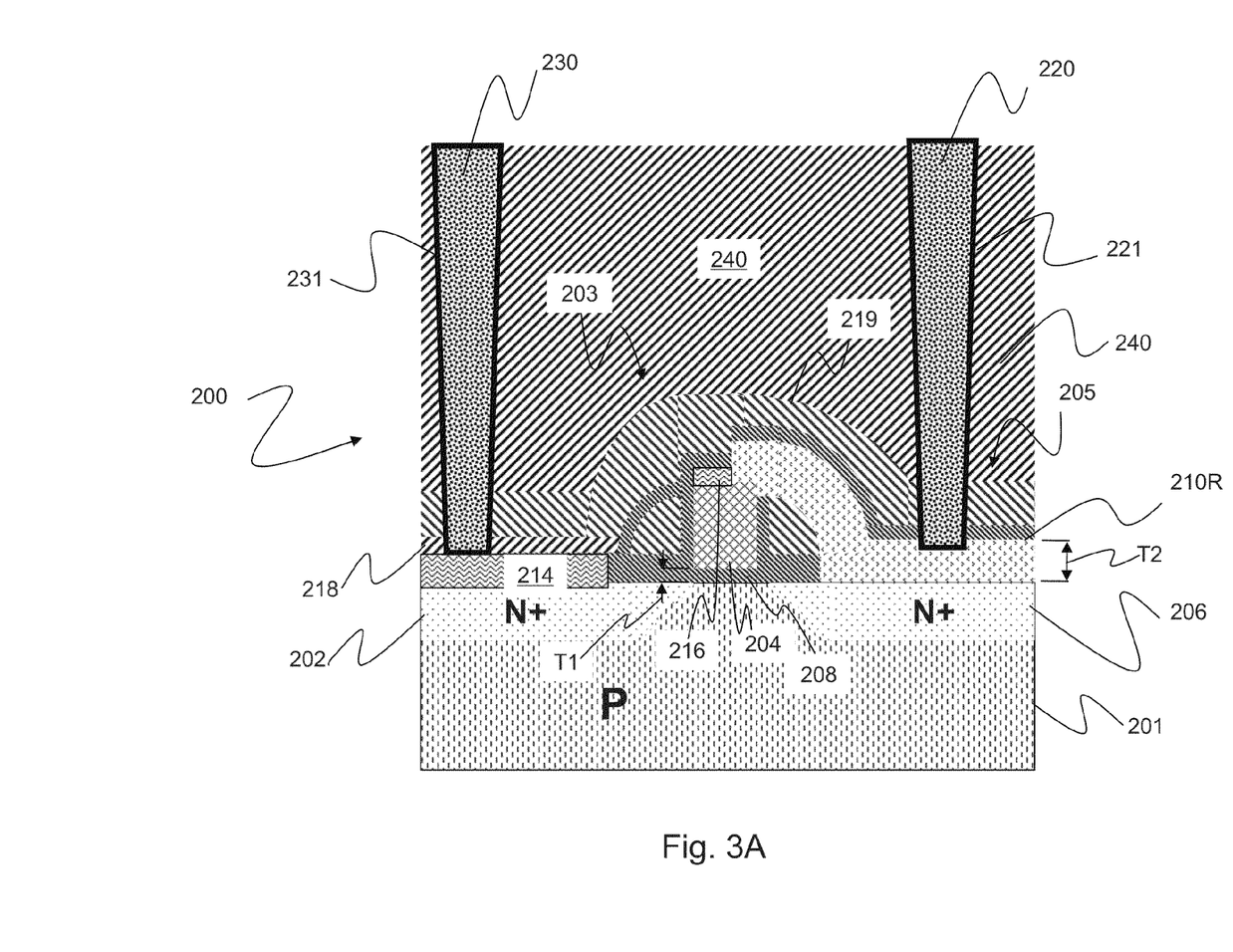
FIG. 3A is a cross sectional view of the antifuse of FIG. 2.

FIG. 2 is a plan view of the antifuse 200 shown in FIG. 1A. FIG. 3AB is a cross-sectional elevation view of the antifuse 200 taken along section line 3-3 of FIG. 2. The antifuse comprises a transistor 203 and a capacitor 205.

The antifuse 200 comprises a substrate 201, which may be silicon, silicon on insulator, or the like. The substrate is doped with P-type impurities, such as boron, aluminum or gallium. The transistor 203 of the antifuse is formed by the CMOS process, including formation of the gate dielectric film 208, which may be grown on the substrate 201. In some embodiments, the gate dielectric is a silicon oxide film having a thickness T1 of about 12 ångström. Alternative embodiments include other dielectrics, such as a variety of high-k dielectric materials.

The gate electrode 204, which may be polysilicon, for example, is formed over the gate dielectric 208. The gate electrode 204 of the antifuse 200 is part of the word line WL, which is formed in the gate electrode layer. A lightly doped drain (LDD) implant is performed using N-type impurities, such as antimony, arsenic or phosphorous. Sidewall spacers are formed adjacent the gate by depositing a conformal oxide layer and conformal nitride layer, and removing the oxide and nitride with an anisotropic etch, which leaves the sidewall spacers abutting the gate electrode 204. A higher dosage of N-type impurities, such as antimony, arsenic or phosphorous is then implanted (outside the gate and LDD regions), to form the N+ bit line (BL) diffusion region 202 and the N+ capacitor diffusion region 206. This self-aligned process results in LDD regions between the channel and source, and between the channel and drain, to prevent so-called short channel effects.

Figure 3B:
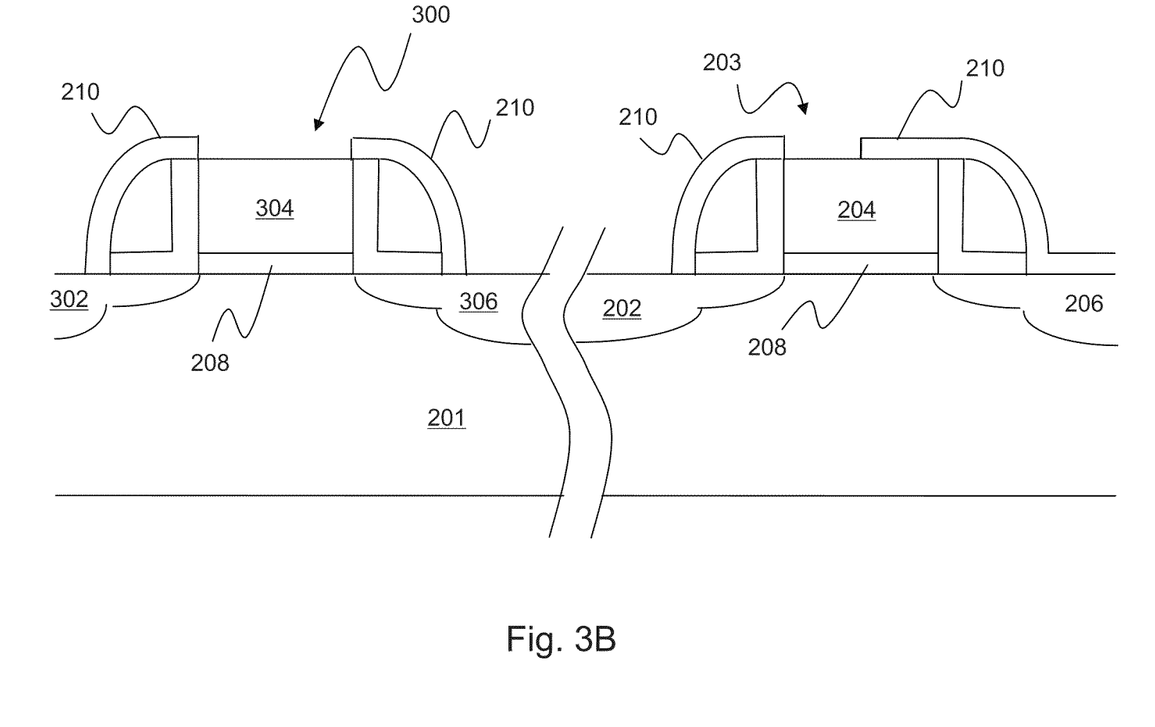
FIG. 3B shows the antifuse of FIG. 2 with a transistor of a memory element on the same substrate, prior to salication.

An RPO layer 210, such as silicon dioxide ($SiO_2$), or silicon oxynitride ($SiO_2N$). is applied via LPCVD or PECVD, for example. A photoresist blockout mask, not shown in the drawings, is used to remove portions of the RPO layer 210, to expose the areas to be silicided. (Bit line BL 202 and a portion of the word line WL 204, as well as the source, drain and gate of each transistor 300 in the memory formed on the same substrate are to be silicided.) The undesired RPO portions may be removed, for example via a selective RIE procedure by using $CHF_3$ as an etchant, or via use of a buffered hydrofluoric acid solution. FIG. 3B shows the same RPO layer 210 on transistor 205 of the antifuse and a transistor 300 of a memory element on the same substrate, after applying the RPO, but before the salicidation.

The oxide layer 210 has a thickness T2 that is substantially greater than the thickness T1 of the gate dielectric layer 208. For example, the RPO thickness T2 may be in a range from about 200 ångströms to about 500 ångströms, as discussed below, which is much greater than a gate dielectric thickness T1 of about 12 ångströms.

A refractory metal layer such as titanium or cobalt is evaporated or sputtered onto the surface of the silicon substrate 201, the gate electrode 204 and the bit line region 202. Thereafter, high temperature heat treatment is performed and the refractory metal layer is made to react with the polysilicon layer of the gate electrode 204 to form a silicide layer 214, 216 of the refractory metal layer on the bit line BL and word line WL (but not on the regions covered by the RPO layer 210). As shown in FIG. 3B, the same RPO layer 210 protects at least one portion of the CMOS device (transistor 300) from formation of silicides during silicidation (of source 302, drain 306 and gate 304) and also forms the capacitor dielectric film 210R of the antifuse 200.

Referring again to FIG. 3A, after salicidation, the RPO layer is removed everywhere else, except that the RPO film in the select line landing region 210R is retained, as shown in FIGS. 2 and 3A. The RPO layer is not removed from the landing region 210R surrounding the location of the select line SL contact plug 220, which is to become the capacitor diffusion region. SL Because a standard CMOS process includes a dedicated RPO mask one of ordinary skill can readily adapt the RPO mask for selective removal of the RPO layer while leaving the RPO in the BL contact plug. Passivation layers 218, 219 are formed. Back end of line (BEOL) processing is performed to form an interconnect structure using a damascene process, for example. Contact holes are formed through the intermetal dielectric (IMD) layer 240. Barrier layers 221 and 231 are formed, and a bulk metal fill process forms the SL contact plug 220 contacting the RPO layer 210R and a bit line contact 230 contacting the bit line diffusion region 202.

As best seen in FIG. 3A, the select line contact plug 220 contacts the RPO layer 210R formed on the select line diffusion region 206. The select line contact 220 is above and contacting the RPO layer 210R to form a capacitor 205 having the RPO layer 210R as a capacitor dielectric layer thereof. The select line contact 220 is configured for applying a voltage to cause permanent breakdown of the RPO layer to program the antifuse 200, forming resistor 207.

As shown in FIG. 3A, the thickness T2 of RPO film 210R is larger than the thickness T1 of the gate dielectric 208. Because the RPO layer thickness T2 does not affect the performance of the transistors on the substrate 201, the RPO thickness T2 can be set to any desired value that is suitable for the capacitor dielectric of an antifuse capacitor (corresponding to a desired programming voltage, such as a voltage in the range from about 3 volts to about 7 volts). Thus, when reducing the dimensions of the transistors to scale down for advanced technology nodes, there is no need to change the RPO thickness T2. By using the same RPO thickness T2, even when reducing the dimensions of active devices, the programming behavior of the antifuse capacitor dielectric is substantially the same between different technology nodes, simplifying the design process. Even for smaller technologies with thin gate dielectric layers, the antifuse capacitor leakage can be maintained low, providing leakage and breakdown behaviors clearly distinguishable from each other.

The contact plug 220 preferably just penetrates the RPO film 210R. The contact plug 220 cannot penetrate all the way to the N+ diffusion region 206 (which would form a short circuit). The contact formation steps should not etch through the RPO to the N+ regular salicide contact on the left side. There are multiple ways to design the antifuse capacitor 205 so that the programming voltage is predictable. Two examples of approaches are described below. As used herein, the term "oxide remain" refers to a distance R1 (FIG. 4B)) between a bottom of the select line contact 220 and a surface of the capacitor bottom electrode (e.g., diffusion region 206).

Figure 4A:
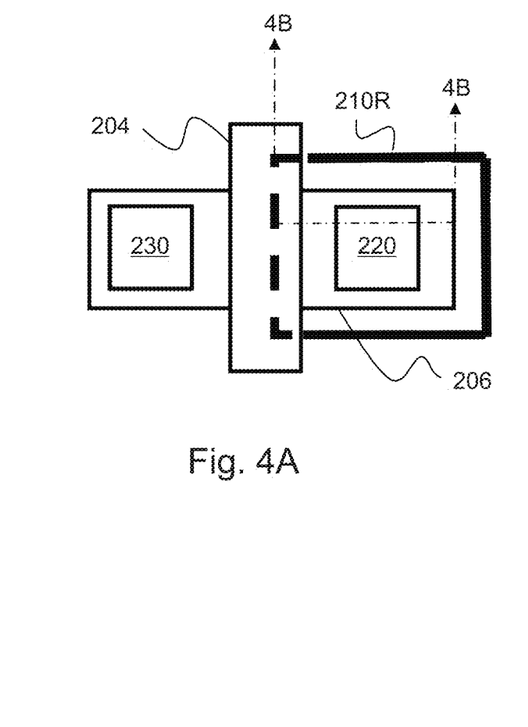
FIG. 4A is a plan view of the antifuse of FIG. 2, with two contact plugs of the same size as each other.
Figure 4B:
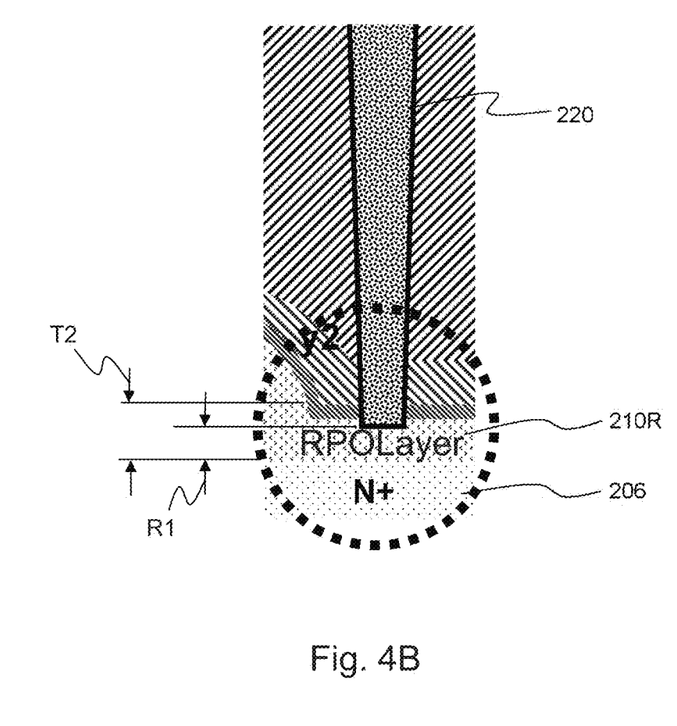
FIG. 4B is a cross sectional view taken along section line 4B-4B of FIG. 4A.

In some embodiments, as shown in FIGS. 4A and 4B, the SL contact plug 220 can be the same regular contact size as BL contact plug 230, but a thicker RPO layer 210 is used. For example, although a prior art process for 90 nm CMOS used an RPO layer of 250 ångström thickness, to control the oxide remain R1, an RPO layer thickness of about 450 to 500 ångströms (about twice the normal RPO thickness) may be used. This technique increases the RPO thickness (and the RPO deposition time), but does not affect any of the maskworks.

Figure 5A:
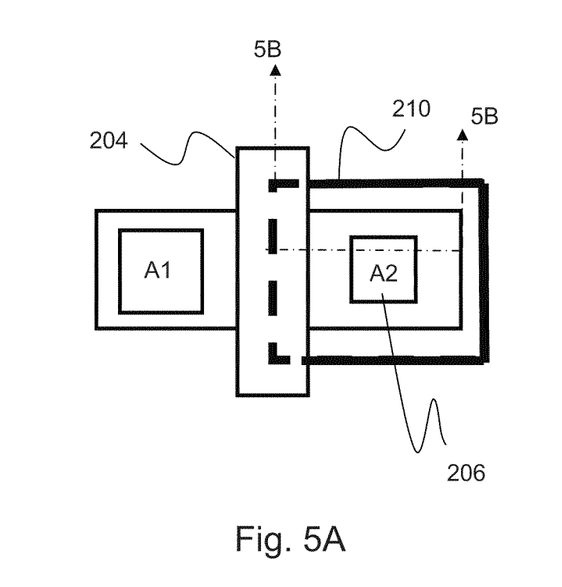
FIG. 5A is a plan view of the antifuse of FIG. 2, with the programmable contact plug smaller than the source/drain contact plug.
Figure 5B:
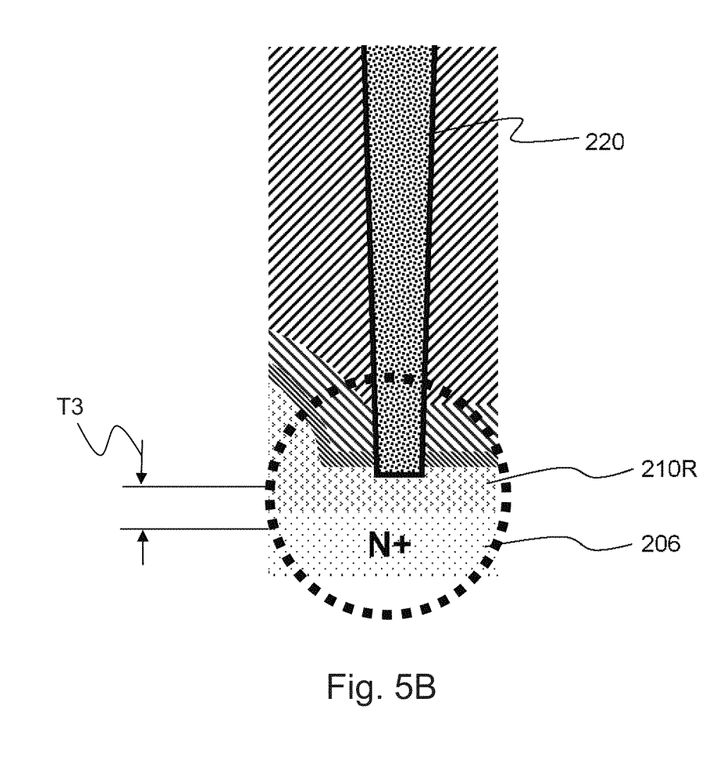
FIG. 5B is a cross sectional view taken along section line 5B-5B of FIG. 5A.

In some embodiments, as shown in FIGS. 5A and 5B, the select line contact 220 has a smaller in-plane cross sectional area at a top thereof than an in-plane cross sectional area of the bit line contact at a top thereof to control the oxide remain R1. If the cross sectional area of contact 220 is smaller, then oxide remain R1 will be thicker. This is because the hole having a smaller diameter at its top results in a reduction in the depth of the hole formed for the contact plug 220. For example, the cross sectional area at the top of contact plug 220 may be about 70% to about 90% of the regular cross sectional area at the top of a regular contact for the same technology node. If the BL contact plug 230 has the regular cross sectional area at its top for a given technology node (e.g., 0.1 to 0.12 μm2 for 90 nm technology), then the area of the SL contact plug 220 at its top is about 70% to 90% of the cross sectional area of the BL contact plug 230. Because the contact plug 220 does not extend as deeply as contact plug 230, it is possible to control the size of oxide remain R1 at a desired value, such as from 30 to 90 ångströms, with an RPO thickness T2 of about 200 to 250 ångströms. In other words, using the regular thickness T2 of the RPO film 210, the oxide remain R1 can be controlled by controlling the SL contact size at its top. Alternatively, if a higher programming voltage is desired, the cross sectional area of contact plug 220 may be selected so that the oxide remain R1 is as high as 150 ångströms (e.g., in a range from about 100 ångströms to about 150 ångströms). One of ordinary skill in the art will appreciate that the technique of changing the cross sectional area of the SL electrode 220 does not result in any change to the process window for forming the RPO layer 210. Only a change to a maskwork is implemented, to change the hole size for contact plug 220.

A method of making an integrated circuit (e.g., a memory device) including at least one active device and at least one antifuse as shown in FIGS. 3A and 3B includes: (a) providing a substrate 201 having a source region 302, a drain region 306, a bit line diffusion region 202 and a capacitor diffusion region 206; (b) forming a gate dielectric layer 208 over the substrate 201; (c) forming a gate electrode 304 on the gate dielectric layer 208 between the source 302 and drain 306 regions so as to form a transistor 300; (d) forming a word line 204 on the gate dielectric layer 208 between the bit line diffusion region 202 and the capacitor diffusion region 206; (e) forming an oxide layer 210R on the capacitor diffusion region 206 in a separate process step from step (b); and (f) forming a select line contact 220 above and contacting the oxide layer 210 to form an antifuse 200 having the oxide layer 210R as a dielectric layer thereof, the select line contact 220 configured for applying a voltage to cause permanent breakdown of the oxide layer 210R to program the antifuse 200.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. An antifuse, comprising:
    a substrate having a bit line diffusion region and a capacitor diffusion region;
    a gate dielectric layer over the substrate;
    a word line on the gate dielectric layer;
    an oxide layer on the capacitor diffusion region and over a portion of the word line, the oxide layer being substantially thicker than the gate dielectric layer and extending continuously from the capacitor diffusion region to over the portion of the word line; and
    a select line contact above and contacting the oxide layer to form a capacitor having the oxide layer as a capacitor dielectric layer thereof, the select line contact configured for applying a voltage to cause permanent breakdown of the oxide layer to program the antifuse.

2. The antifuse of claim 1, wherein the oxide layer is sufficiently thick so that a distance between a bottom of the select line contact and a surface of the capacitor diffusion region is from 2.5 to 7.5 times a thickness of the gate dielectric layer.

3. The antifuse of claim 2, wherein the gate dielectric layer has a thickness of about 12 ångströms, and the distance between the bottom of the select line contact and the surface of the capacitor diffusion region is from 30 to 150 ångströms.

4. The antifuse of claim 1, wherein the oxide layer has a thickness substantially greater than 12 ångströms, and the antifuse uses a complementary metal oxide semiconductor (CMOS) technology having a critical dimension of 90 nm or less.

5. The antifuse of claim 1, further comprising a complementary metal oxide semiconductor (CMOS) transistor formed on the same substrate as the antifuse and wherein the oxide layer is a resist protective oxide layer formed over at least one portion of the CMOS transistor.

6. The antifuse of claim 1, further comprising a bit line contact coupled to the bit line diffusion region, wherein the select line contact has a smaller in-plane cross sectional area at a top thereof than an in-plane cross sectional area of the bit line contact at a top thereof.

7. The antifuse of claim 5, wherein the in-plane cross sectional area of the select line contact is from about 70% to about 90% of the in-plane cross sectional area of the bit line contact.

8. A method of making an antifuse, comprising:
    (a) providing a substrate having a bit line diffusion region and a capacitor diffusion region therein,
    (b) forming a gate dielectric layer over the substrate, and a word line on the gate dielectric layer;
    (c) forming an oxide layer on the capacitor diffusion region and over a portion of the word line, in a separate process step from step (b), the oxide layer having a substantially greater thickness than the gate dielectric layer and extending continuously from the capacitor diffusion region to over the portion of the word line;
    (d) forming a select line contact above and contacting a segment of the oxide layer that extends over the portion of the word line, to form a capacitor having the oxide layer as a capacitor dielectric layer thereof, the select line contact configured for applying a voltage to cause permanent breakdown of the oxide layer to program the antifuse; and
    (e) further forming a complementary metal oxide semiconductor (CMOS) transistor device on the substrate, said CMOS transistor device including a gate electrode over said dielectric layer and source and drain regions disposed in the substrate and laterally separated from the bit line diffusion region and the capacitor diffusion region.

9. The method of claim 8, wherein the oxide layer is a resist protective oxide (RPO) layer formed over at least one portion the CMOS transistor device.

10. The method of claim 9, wherein the RPO layer protects the at least one portion of the CMOS device from formation of silicides on the at least one portion during silicidation.

11. The method of claim 8, wherein the oxide layer is sufficiently thick so that a distance between a bottom of the select line contact and a surface of the capacitor diffusion region is from 2.5 to 7.5 times a thickness of the gate dielectric layer.

12. The method of claim 8, wherein the oxide layer has a thickness substantially greater than 1.2 nm, and the antifuse is formed by a complementary metal oxide semiconductor (CMOS) technology having a critical dimension of 90 nm or less.

13. The method of claim 8, wherein the oxide layer is about 500 ångströms thick, and the antifuse is formed by a complementary metal oxide semiconductor (CMOS) technology having a critical dimension of 90 nm or less.

14. The method of claim 8, further comprising a bit line contact coupled to the bit line diffusion region, wherein the select line contact has a smaller in-plane cross sectional area at a top thereof than an in-plane cross sectional area of the bit line contact at a top thereof.

15. The method of claim 14, wherein the in-plane cross sectional area of the select line contact is from about 70% to about 90% of the in-plane cross sectional area of the bit line contact.

16. A method of making an integrated circuit, comprising:
(a) providing a substrate having a separate source region, drain region, bit line diffusion region and capacitor diffusion region, the source region, drain region, bit line diffusion region and capacitor diffusion region each laterally spaced apart from one another;
(b) forming a gate dielectric layer over the substrate;
(c) forming a gate electrode on the gate dielectric layer between the source and drain regions so as to form a transistor;
(d) forming a word line on the gate dielectric layer between the bit line diffusion region and the capacitor diffusion region;
(e) forming an oxide layer on the capacitor diffusion region in a separate process step from step (b); and
(f) forming a select line contact above and contacting a segment of the oxide layer to form an antifuse having the oxide layer as a dielectric layer thereof, the select line contact configured for applying a voltage to cause permanent breakdown of the oxide layer to program the antifuse without affecting performance of the transistor,
wherein the segment extends over a portion of the word line.

17. The method of claim 16, wherein the oxide layer is a resist protective oxide (RPO) layer formed over at least one portion of the transistor during step (e).

18. The method of claim 17, wherein the RPO layer protects the at least one portion of the transistor from formation of silicides on the at least one portion during a silicidation.

19. The method of claim 16, wherein the oxide layer is substantially thicker than the gate dielectric layer and extends continuously from the capacitor diffusion region to over a portion of the word line.

20. A method of making an integrated circuit, comprising:
(a) providing a substrate having a source region, a drain region, a bit line diffusion region and a capacitor diffusion region;
(b) forming a gate dielectric layer over the substrate;
(c) forming a gate electrode on the gate dielectric layer between the source and drain regions so as to form a transistor;
(d) forming a word line on the gate dielectric layer between the bit line diffusion region and the capacitor diffusion region;
(e) forming an oxide layer on the capacitor diffusion region in a separate process step from step (b); wherein the oxide layer is a resist protective oxide (RPO) layer formed over at least one portion of the transistor and which protects the at least one portion of the transistor from formation of silicides on the at least one portion during a silicidation;
(f) forming a select line contact above and contacting the oxide layer to form an antifuse having the oxide layer as a dielectric layer thereof, the select line contact configured for applying a voltage to cause permanent breakdown of the oxide layer to program the antifuse; and,
further comprising removing the RPO layer from the at least one portion of the transistor after the silicidation.

* * * * *

UNITED STATES PATENT AND TRADEMARK OFFICE
CERTIFICATE OF CORRECTION

| | |
|---|---|
| PATENT NO. | : 8,754,498 B2 |
| APPLICATION NO. | : 12/606497 |
| DATED | : June 17, 2014 |
| INVENTOR(S) | : Yue-Der Chih et al. |

It is certified that error appears in the above-identified patent and that said Letters Patent is hereby corrected as shown below:

In the Claims:

Column 6, Line 67, insert -- of -- at the beginning of the line.

Signed and Sealed this
Third Day of February, 2015

Michelle K. Lee
*Deputy Director of the United States Patent and Trademark Office*